United States Patent
Huang et al.

(10) Patent No.: US 7,101,796 B2
(45) Date of Patent: Sep. 5, 2006

(54) METHOD FOR FORMING A PLANE STRUCTURE

(75) Inventors: Jui-Tsen Huang, Taipei (TW); Kuei-Chun Hung, Hsin-Chu (TW)

(73) Assignee: United Microelectronics Corp., (TW)

( * ) Notice: Subject to any disclaimer, the term of this patent is extended or adjusted under 35 U.S.C. 154(b) by 341 days.

(21) Appl. No.: 10/410,255

(22) Filed: Apr. 10, 2003

(65) Prior Publication Data

US 2004/0033628 A1    Feb. 19, 2004

Related U.S. Application Data

(63) Continuation-in-part of application No. 10/217,471, filed on Aug. 14, 2002, now Pat. No. 6,624,055.

(51) Int. Cl.
*H01L 21/302* (2006.01)

(52) U.S. Cl. .................. 438/689; 438/745; 438/725

(58) Field of Classification Search ............. 438/689, 438/725, 745
See application file for complete search history.

(56) References Cited

U.S. PATENT DOCUMENTS

| 5,244,839 A | 9/1993 | Baker et al. |
| 5,473,187 A | 12/1995 | Baker et al. |
| 5,569,614 A | 10/1996 | Kataoka et al. |
| 5,753,940 A | 5/1998 | Komoto |
| 6,020,639 A * | 2/2000 | Ulrich et al. ............. 257/750 |
| 6,245,640 B1 | 6/2001 | Claussen et al. |
| 6,406,994 B1 | 6/2002 | Ang et al. |
| 2001/0054735 A1 | 12/2001 | Nagai |
| 2002/0132393 A1 | 9/2002 | Kraxenberger et al. |
| 2005/0178401 A1* | 8/2005 | Boyers ...................... 134/1.3 |

* cited by examiner

*Primary Examiner*—Thanh Nguyen (57) ABSTRACT

A method for forming a plane structure. It comprises the following steps: forms a liquid material with a thicker thickness on a substrate, rotating both the liquid material and the substrate around the axis of the substrate, applying a solvent on the rotating liquid material to remove partial liquid material. It also comprises the following steps: form a thicker removable material on a substrate, and partially remove the surface part of the removable material.

7 Claims, 8 Drawing Sheets

METHOD FOR FORMING A PLANE STRUCTURE

This application is a continuation-in-part of U.S. patent application Ser. No. 10/217,471, filed Aug. 14, 2002 now U.S. Pat. No. 6,624,055, which is incorporated by reference herein in its entirety.

BACKGROUND OF THE INVENTION

1. Field of the Invention

The invention relates to the method for transferring patterns. Specifically, the invnetion is related to the method which effectively prevents the defects induced by damaged photoresist during the pattern transferring process.

2. Description of the Prior Art

In some semiconductor fabrications, N-type transistors and P-type transistors are formed with the following steps in sequence: forms a conductor layer on a substrate, doping numerous impurities into the conductor layer, and patterning the conductor layer. For example, after the conductor layer is formed, both the N-type transistor areas and the P-type transistor are doped immediately. For example, after the conductor layer is formed, only the gate area of one type transistor is doped but the gate area of another type transistor is not doped, such that only some transistors have doped gate conductor layer but other transistors only have undoped gate conductor layer.

Such semiconductor fabrications usually are used to avoid the defects of the following processes, while the gates are formed by the pattern process before the doping process is performed. For example, because both the gates and the substrate are not covered after the pattern process and before the doping process, it is hard to precisely control the doping process to let only the gate conductor layer be doped but both the source and the drain be not doped, especially being hard to precisely control the doping process to let only partial gate conductor layer be doped.

However, such semiconductor fabrications also have the following defects:

Although the N-type transistors and the P-type transistors usually use same material to form their gate conductor layer, the doped density and the doped impurities often are different between them. Hence, because different doped materials usually have different etch details, such as etching rate and prefer etch recipe, even they are formed from the same undoped material, it is hard to precisely form P-type transistors and N-type transistors simultaneously if the doped details of P-type transistors are different than that of N-type transistors. For example, while the gate area of N-type transistors is doped but the gate area of the P-type transistors is not doped, each P-type gate usually is wider than each N-type gate even their patterns have same width in the corresponding photo-mask.

Because the substrate must be covered by an anti-reflection layer, such as a SiON layer, before the exposing process, it is desired to remove the anti-reflection layer after the etching process and then the damages of formed structures, such as formed gates, often are unavoidable. For example, while the phosphoric acid is used to remove the SiON layer, not only the gate conductor layers are etched by the phosphoric acid but also different gate conductor layers with different doped details have different etch damages.

It often is desired to perform a thermal treatment before the patterning process to re-distribute or diffuse the impurities doped into the conductor layer or the substrate through the conductor layer. Clearly, both the fabrication steps and relative cost are increased.

Moreover, because the etch properties of different materials, such as doped polysilicon and undoped polysilicon, usually are different, an optimum etching recipe of one material usually is not effective for another material. Hence, while different parts of a substrate have different doped properties, it is hard to effectively etch the whole conductor layer on the whole substrate. Sometimes it is hard to etch different parts in a chamber simultaneously, sometimes it is impossible to etch different parts at the same time.

Besides, the conductor layer sometimes is not totally smooth, no matter is induced by the existent field oxide before the formation of the conductor layer or is induced by the unavoidable defect(s)of the fabrication of the conductor layer. Hence, the doping result sometimes is not uniform enough. For example, if the conductor layer is thinner on some parts of the substrate, the doping process for forming the doped gate conductor layer may also dope some impurities into these parts. Thus, for any transistor located in these parts, not only the gate conductor layer is doped but also both the source and the drain are doped, which is an unwanted defect.

SUMMARY OF THE INVENTION

One main object of this invention is to improve the conventional technology that patterns the gates before the impurities are doped, such that the previous defects induced by the conventional technology that dopes impurities before the gates be patterned.

Another main object of this invention is to provide a method for forming the plane structure, especially a forming plane structure method which could be used to archive the formed object.

One preferred embodiment of the invention is a semiconductor fabrication. Initially, provide a substrate and form both numerous first gates and numerous second gates on the substrate. Next, form a first cover layer to cover the substrate, the first gates and the second gates. Then, form a second cover layer to cover partial substrate, the second cover layer only covers the second gates but not covers any first gate. Sequentially, perform a doping process. Finally, remove both second cover layer and first cover layer.

Another preferred embodiment of the method is a method for forming a plane structure. First, provide a substrate. Then, form a liquid material on the substrate. Finally, remove partial liquid material by a spin-etch process to form a plane structure. Herein, the spin-etch process rotates both substrate and liquid material around an axis of substrate and applies a solvent on liquid material to remove partial liquid material simultaneously.

The other preferred embodiment of the invention is a method for forming a plane structure. First, provide a substrate. Next, form a photoresist layer on the substrate. Then, treat the photoresist layer by a part-expose process such that only the surface part of the photoresist layer is exposed. Finally, remove exposed part of the photoresist layer.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Figure 1A:
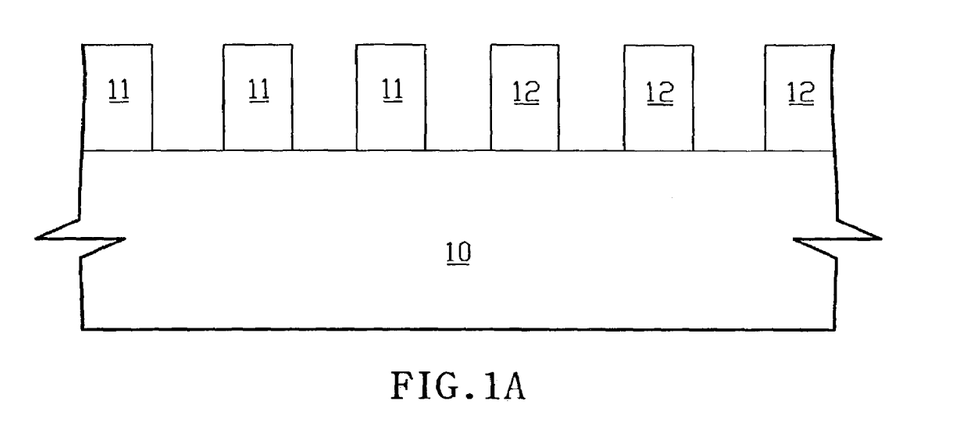
FIG. 1A through FIG. 1M qualitatively show the essential steps of one preferred embodiment of the invention and some available amendments of the preferred embodiment.

One preferred embodiment of the invention is a semiconductor fabrication. The embodiment at least has the following essential steps:

As shown in FIG. 1A, provide substrate 10 and form numerous first gates 11 and numerous second gates 12 on substrate.

Figure 1B:
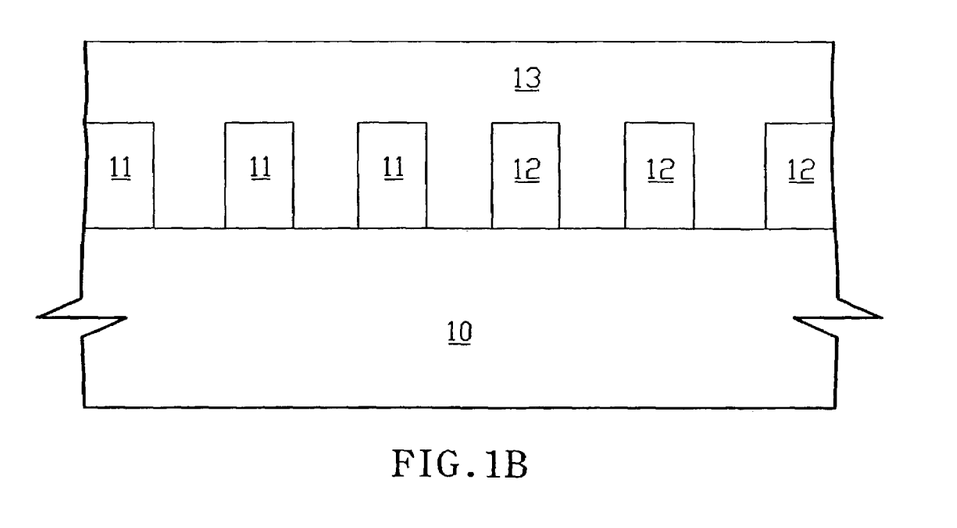

As shown in FIG. 1B, cover substrate 10 by first cover layer 13. Herein, first cover layer 13 also covers first gates 11 and second gates 12.

Figure 1C:
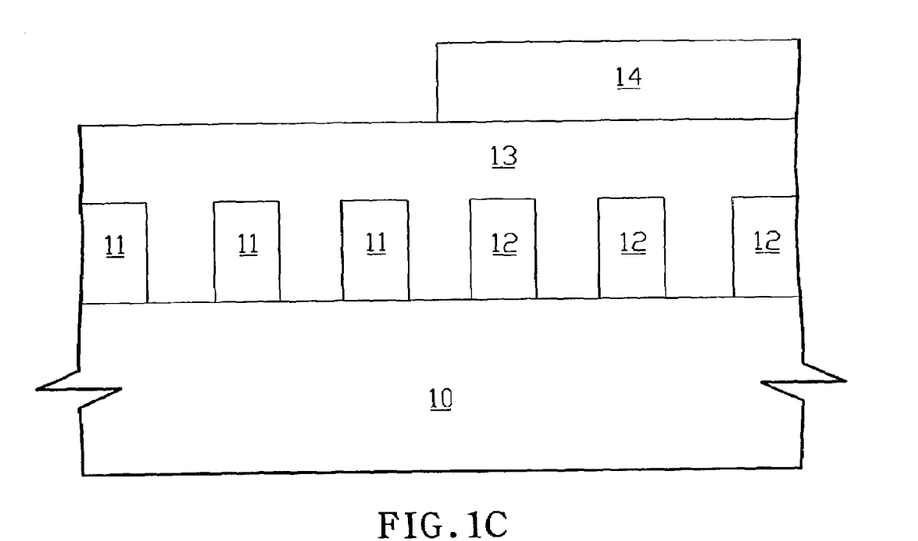

As shown in FIG. 1C, covers partial substrate 10 by second cover layer 14. Herein, second cover layer 14 is located over second gates 12 but is not located over first gates 11.

Figure 1D:
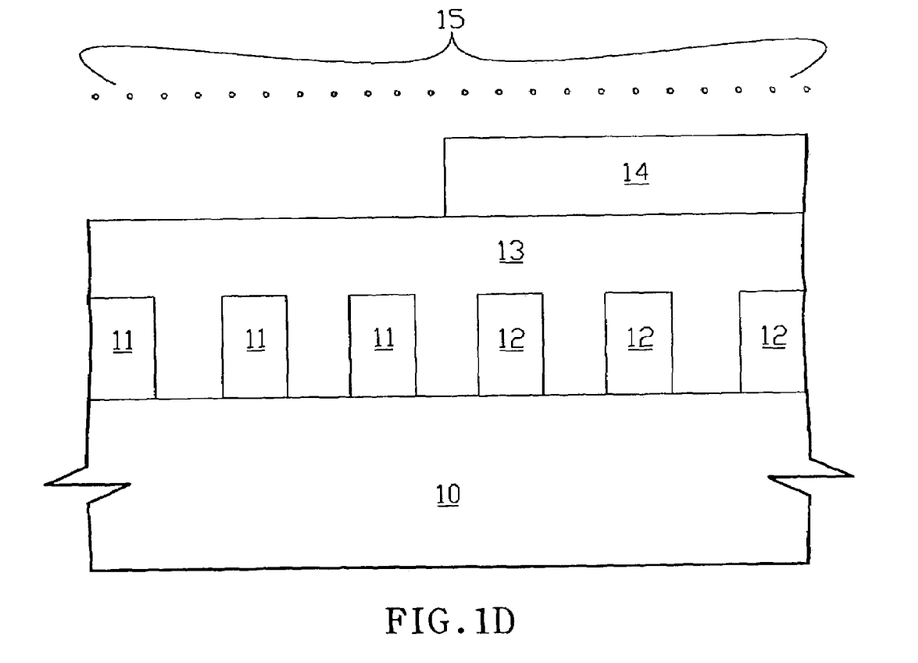

As shown in FIG. 1D, perform a doping process. Herein, it is possible to dope numerous impurities 15 only into first gates 11, it also is possible to dope impurities 15 into both first gates 11 and partial substrate 10 around first gates 11. The embodiment never limits any detail of the doping process.

Figure 1E:
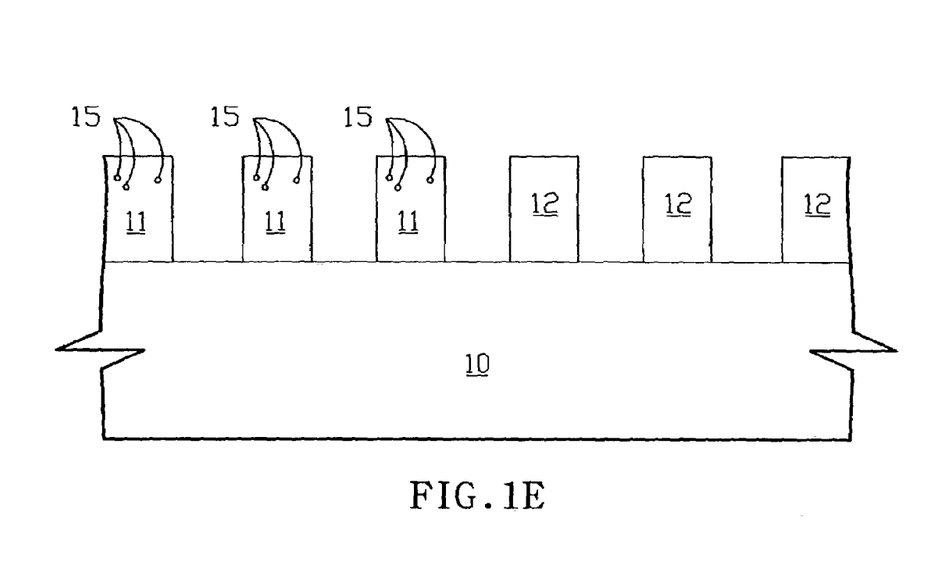

As shown in FIG. 1E, remove second cover layer 14 and first cover layer 13. Herein, because the details of the doping process are not limited, the distribution of doped impurities 15 also is not limited. FIG. 1E only shows a possible distribution of doped impurities 15: impurities 15 only are doped into first gates 11.

Clearly, the embodiment performs the doping process after the patterning process for forming gates is finished, and then any defect induced by the first-doping-then-patterning method is avoided. Further, because the embodiment forms two cover layers with different distribution after the patterning process and before the doping process, the embodiment could precise details control which part is doped and the distribution of impurities.

Certainly, although the embodiment only uses two cover layers, the spirit of the invnetion is not limited by "two". The embodiment could be expanded to use several cover layers to precise the effect of the doping process, where each cover layer has individual shape and individual distribution.

Furthermore, if only first gates 11 need to be doped but any substrate 10 around each of first gates 11 need not to be doped, the embodiment could be amended to let first cover layer 11 only cover substrate 10 around first gates 11 but not cover any first gate 11. Hence, the following doping process could directly dopes impurities 15 into first gates 11, effectively improve the conventional defects that it is hard to only dope partial gates but not dope both other gates and gate.

Figure 1F:
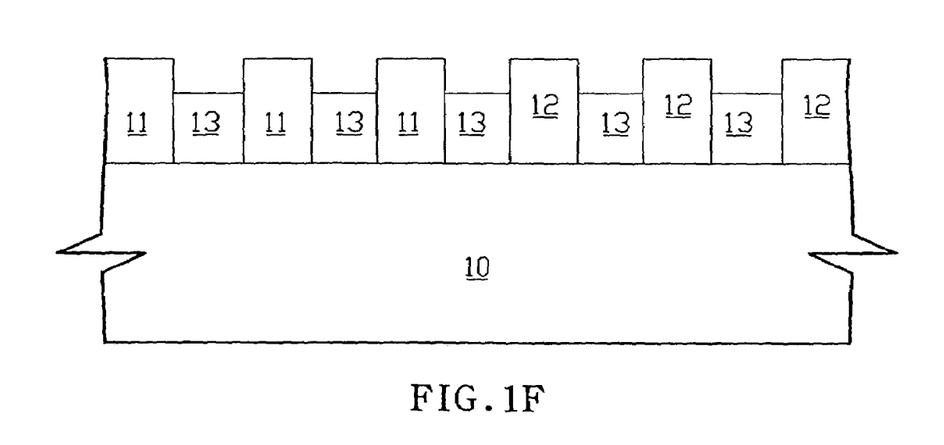

Meanwhile, the steps from FIG. 1C through FIG. BE are amended as the steps from FIG. 1F through FIG. 1I:

As shown in FIG. 1F, treat first cover layer 13 with a treating process such that none of first gates 11 is covered by first cover layer 13. Herein, FIG. 1F shows the case that the thickness of first cover layer 13 is globally reduced such that the treated first cover layer 13 is thinner than first gates 11. However, the embodiment does not limit the details of the treating process. It is possible to only remove partial first cover layer 13 on first gates 11, it also is possible to only reduce the thickness of partial first cover layer 13 over first gates 11 but not reduce the thickness of other first cover layer 13.

Figure 1G:
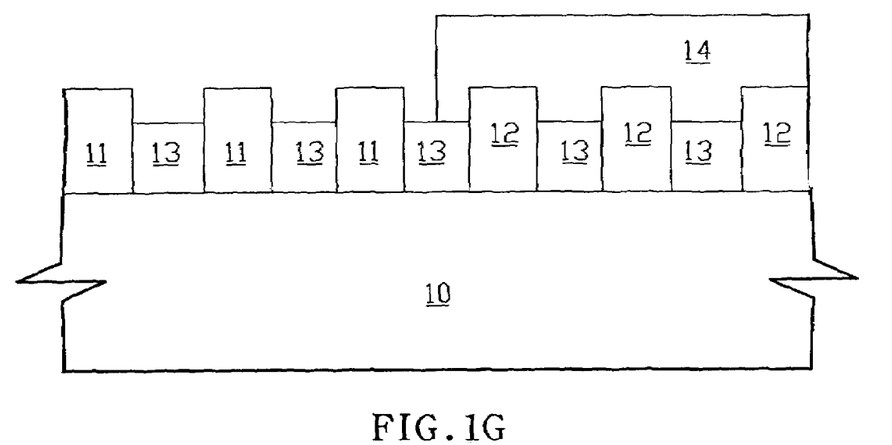

As shown in FIG. 1G, covers partial substrate 10 by second cover layer 14. Herein, second cover layer 14 is located over second gates 12 but is not located over first gates 11.

Figure 1H:
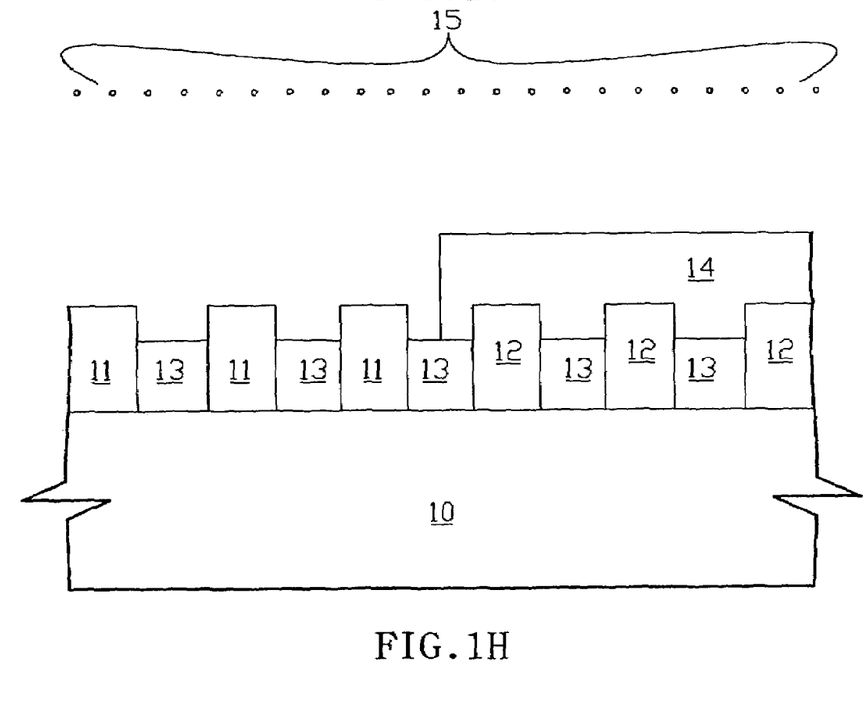

As shown in FIG. 1H, perform a doping process. Herein, it is possible to dope numerous impurities 15 only into first gates 11, it also is possible to dope impurities 15 into both first gates 11 and partial substrate 10 around first gates 11. The embodiment never limits any detail of the doping process.

Figure 1I:
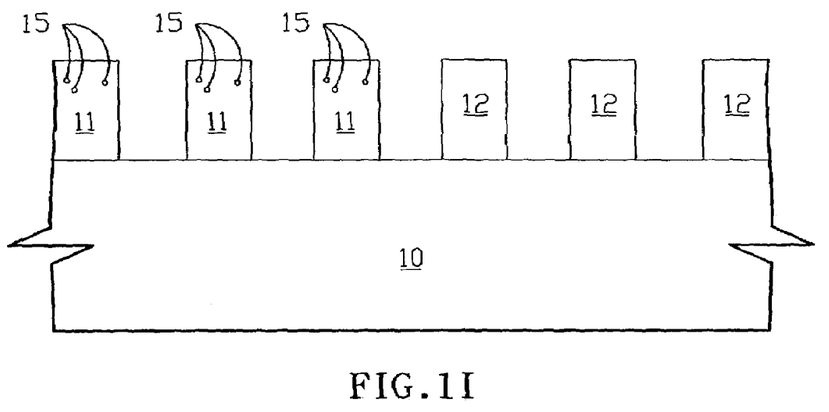

As shown in FIG. 1I, remove second cover layer 14 and first cover layer 13. Herein, because the details of the doping process are not limited, the distribution of doped impurities 15 also is not limited. FIG. 1E only shows a possible distribution of doped impurities 15: impurities 15 only are doped into first gates 11.

Figure 1J:
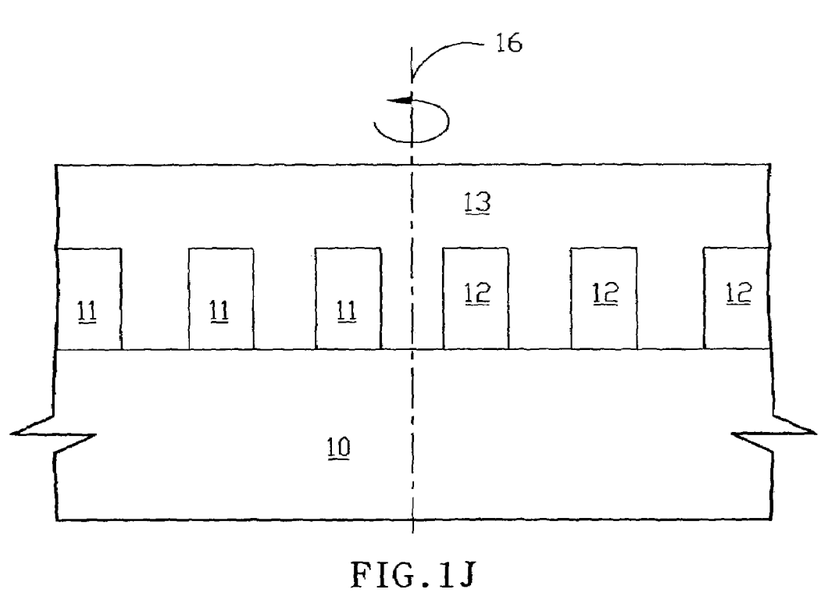

Additional, while the material of first cover layer 13 is a liquid material, or any material could be firstly applied on substrate 10 as a liquid material and then be solidified, such as the photoresist material, the treating process could be a spin-etch process with a etch rate not less than 500 angstroms/minute or a spin-etch process with a etch uniformity not larger than 10 percents, wherein the etch uniformity equals a ratio of a thickness difference between a maximum thickness and a minimum thickness of the liquid material and the maximum thickness of the liquid material, which at least has the following essential steps:

As shown in FIG. 1J, rotate substrate 10, first gates 11, second gates 12, and first cover layer 13 around axis 16 of substrate 10. Herein, FIG. 1J only is a brief illustration, the embodiment never limits the geometrical relation between axis 16 and first gates 11, second gates 12, and first cover layer 13.

Figure 1K:
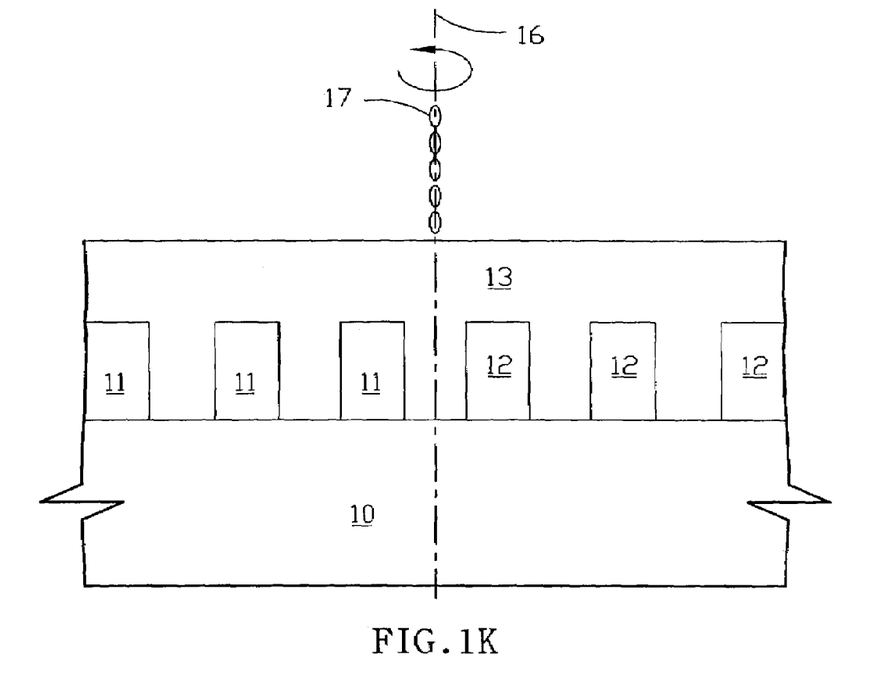

As shown in FIG. 1K, apply solvent 17 on first cover layer 13 to remove partial first cover layer 13.

Significantly, the spin-etch process is similar with the convention spin-on glass or spin coating photoresist. The main difference is that the spin-etch process apply solvent 17 on first cover layer 17 and rotate substrate 10 at the same time. Indisputably, by applying of solvent 17, the spin-etch process is more effective than the conventional spin-on glass or spin coating photoresist, and is more suitable to form a thin layer while the material of the tin layer is hard to directly forms a thin film.

In general, suitable material of the spin-etch process at least has resin, synthetic resin, photoresist, polymer, low dielectric constant dielectric material, and photoresist without acid. And suitable solvent of the spin-etch process at least has developer, acid, and alkali.

Besides, the embodiment also could be amended as the following: firstly rotate substrate 10 around axis 16 of substrate 10, and then forms cover first cover layer 13 (liquid material) on substrate 10. In other words, after the steps shown in FIG. 1A is finished, firstly rotates substrate 10, next, forms first cover layer 13, and then performs the steps shown in FIG. 1F through FIG. 1K.

Figure 1L:
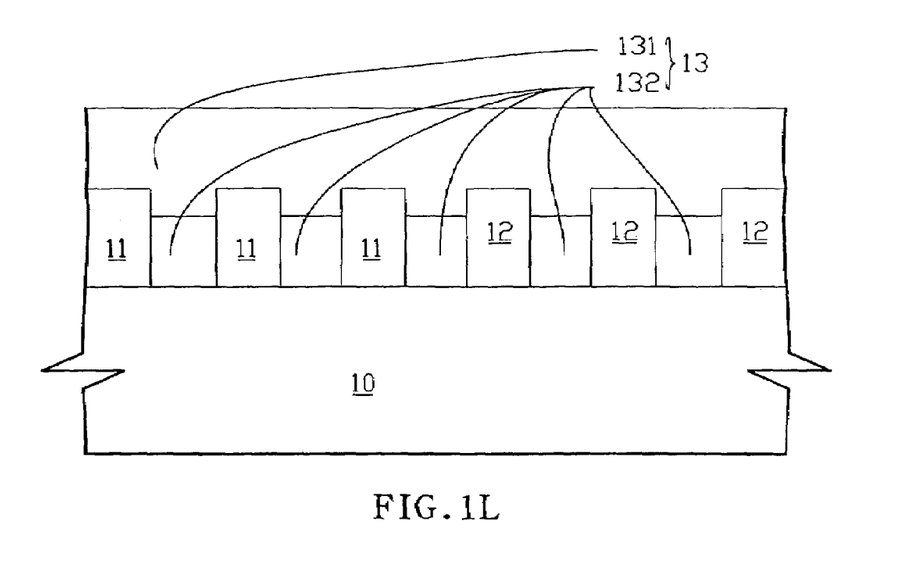

Besides, while the material of first cover layer 13 is photoresist or any photo-sensitive material, the treating process could be a part-expose process which at least has the following essential steps:

As shown in FIG. 1L, expose partial first cover layer 13. Herein, the non-exposed first cover layer 13 is thinner than any first gate 11.

Figure 1M:
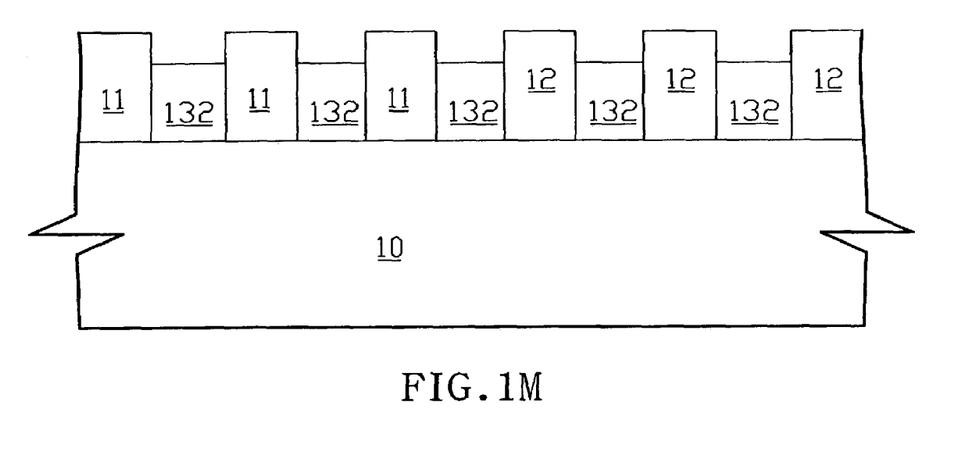

As shown in FIG. 1M, remove exposed first cover layer 131 such that each first gate 11 is separated from other first gates 11 by non-exposed first cover layer 132.

Note that the part-expose process only expose the whole surface of first cover layer 13 (photoresist layer), but not transfer any pattern into first cover layer 13 (photoresist layer).

Furthermore, both the spin-etch process and the part-expose process only are applied to plane first cover layer 11, especially to reduce the thickness of first cover layer 11, but is independent on other part of the embodiment. Hence, both the spin-etch process and the part-expose process could be separated from other parts of the previous embodiment, and could be viewed as two preferred embodiments of the invnetion, especially two methods for forming the plane structure.

Figure 2:
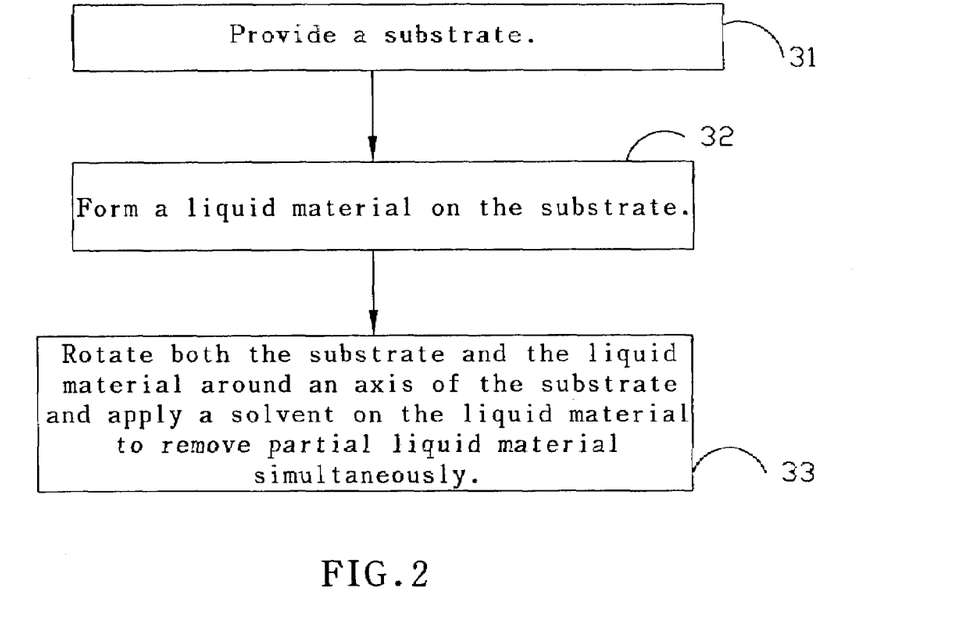
FIG. 2 shows the essential flow chart of another preferred embodiment of the invention.

Another preferred embodiment is a method for forming a plane structure. As shown in FIG. 2, the embodiment at least has the following essential steps:

As shown in background block 21, provide a substrate.

As shown in liquid material block 22, form a liquid material on the substrate.

As shown in spin-etch block 23, rotate both the substrate and the liquid material around an axis of the substrate and apply a solvent on the liquid material to remove partial liquid material simultaneously.

Herein, it is possible to form a pattern structure on the substrate before the liquid material is formed. In the case, the pattern structure is thicker than the liquid material, and the spin-etch process is used to reduce the thickness of the liquid material. Moreover, suitable material of the spin-etch process at least has resin, synthetic resin, photoresist, polymer, low dielectric constant dielectric material, and photoresist without acid. And suitable solvent of the spin-etch process at least has developer, acid, and alkali. Moreover, solvent usually is directly applied on the axis of the substrate such that the solvent uniformly distributed over the substrate.

Figure 3:
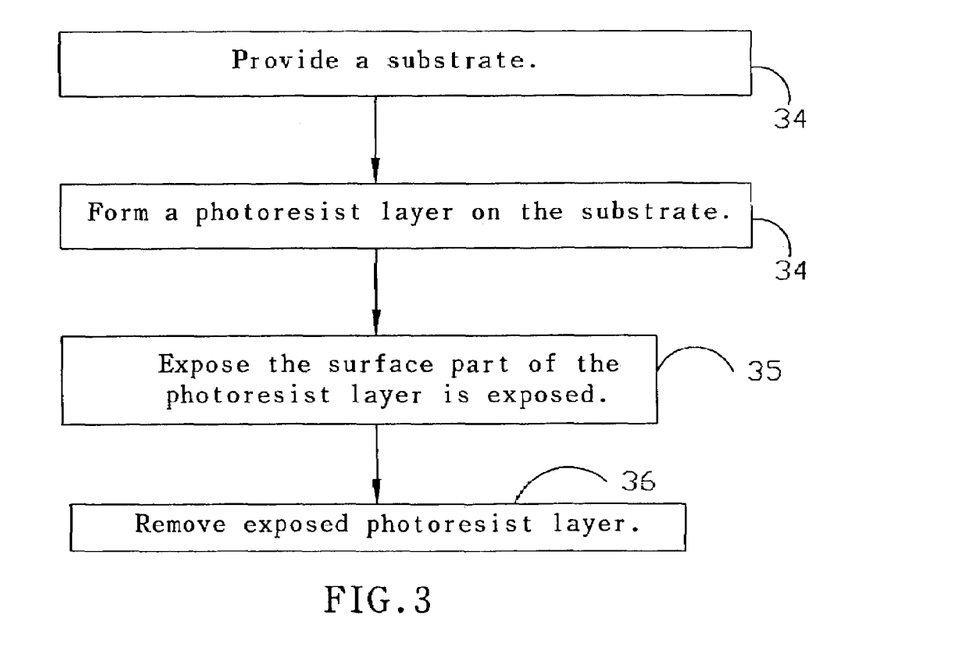
FIG. 3 shows the essential flow chart of the other preferred embodiment of the invention

The other preferred embodiment is a method for forming a plane structure. As shown in FIG. 3, the embodiment at least has the following essential steps:

As shown in background block 31, provide a substrate.

As shown in photoresist block 32, form a photoresist layer on the substrate.

As shown in part-expose block 33, expose the surface part of the photoresist layer is exposed.

As shown in removal block 34, remove exposed photoresist layer.

Similarly, it is possible to form a pattern structure on the substrate before the photoresist layer is formed. In the case, the pattern structure is thicker than the liquid material.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A method for forming a plane structure, comprising:
   providing a substrate having at least one first gate electrode and at least one second gate electrode thereon;
   forming a liquid material on said substrate to cover said first gate electrode and said second gate electrode; and
   treating said liquid material by a spin-etch process with an etch rate not less than 500 angstroms/minute after said liquid material is solidified to remove partial said liquid material and expose said first gate electrode and said second gate electrode.

2. The method of claim 1, said spin-etch process rotating both said substrate and said liquid material around an axis of said substrate and applying a solvent on said liquid material to remove partial said liquid material simultaneously.

3. The method of claim 1, said liquid material being chosen from the group consisting of the following: resin, synthetic resin, photoresist, polymer, low dielectric constant dielectric material, and photoresist without acid.

4. The method of claim 2, said solvent being chosen from the group consisting of the following: developer, acid, and alkali.

5. The method of claim 2, further comprising the step of rotating said substrate around said axis before said liquid material is formed on said substrate.

6. The method of claim 1, said solvent being directly applied on said axis of said substrate during said spin-etch process.

7. The method of claim 1, further comprising:
   forming a cover layer to cover said second gate electrode; and
   perform a doping process to dope impurities only into said first gate electrode.

* * * * *